United States Patent
Liu et al.

(10) Patent No.: US 9,040,988 B2
(45) Date of Patent: May 26, 2015

(54) THIN FILM TRANSISTOR AND MANUFACTURING METHOD THEREOF, AND ARRAY SUBSTRATE

(71) Applicant: Boe Technology Group Co., Ltd., Beijing (CN)

(72) Inventors: Zheng Liu, Beijing (CN); Chunping Long, Beijing (CN); Pil Seok Kim, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/963,372

(22) Filed: Aug. 9, 2013

(65) Prior Publication Data

US 2014/0070217 A1 Mar. 13, 2014

(30) Foreign Application Priority Data

Sep. 11, 2012 (CN) .......................... 2012 1 0335866

(51) Int. Cl.
*H01L 29/786* (2006.01)
*H01L 21/336* (2006.01)
*H01L 29/66* (2006.01)

(52) U.S. Cl.
CPC .... *H01L 29/78669* (2013.01); *H01L 29/66765* (2013.01); *H01L 29/66757* (2013.01)

(58) Field of Classification Search
CPC .................... H01L 29/66757; H01L 29/66765

USPC ............... 257/66, 72; 438/158, 162, 164, 166
See application file for complete search history.

(56) References Cited

U.S. PATENT DOCUMENTS

| 2002/0086507 A1* | 7/2002 | Park et al. ..................... 438/585 |
| 2006/0258064 A1* | 11/2006 | Chen et al. ..................... 438/149 |
| 2010/0227458 A1* | 9/2010 | Chung et al. ..................... 438/487 |

OTHER PUBLICATIONS

First Chinese Office Action dated Jul. 18, 2014; Appln. No. 201210335866.9.
Second Chinese Office Action dated Mar. 16, 2015; Appln. No. 20120335866.9.

* cited by examiner

*Primary Examiner* — Daniel Shook
(74) *Attorney, Agent, or Firm* — Ladas & Parry LLP

(57) ABSTRACT

The disclosure discloses a thin film transistor and a manufacturing method thereof, an array substrate, and a display device, which can manufacture a thin film transistor with lower contents of impurity at a low temperature. The thin film transistor comprises: a substrate, and an active layer disposed on the substrate, the active layer comprising a source region, a drain region and a channel region, wherein the active layer is formed by depositing an inducing metal on an amorphous silicon layer on the substrate by an atomic layer deposition (ALD) method and then conducting heat treatment on the amorphous silicon layer deposited with the inducing metal so that metal induction crystallization and metal induction lateral crystallization take place in the amorphous silicon layer.

9 Claims, 3 Drawing Sheets

THIN FILM TRANSISTOR AND MANUFACTURING METHOD THEREOF, AND ARRAY SUBSTRATE

TECHNICAL FIELD

Embodiments of the present disclosure relate to a thin film transistor and a manufacturing thereof, an array substrate, and a display device.

BACKGROUND

With the continuous progress of technology, the demand for liquid crystal display apparatus grows increasingly. Thin film transistor liquid crystal displays (TFT-LCDs) also have become the dominant display devices used for mobile phones, flat panel computers and the like products. In addition, the demands for high color quality, high contrast ratio, wide viewing angle, quick response speed and low power consumption become increasingly widespread, and organic light emitting diode (OLED) displays enter the market gradually.

At present, it is the amorphous silicon thin film field effect transistor that has been commonly applied to the liquid crystal display industry with mature process. But, due to its low mobility, big size and poor stability, it is difficult to apply such transistor to high definition TFT-LCDs and current-driven type TFT-OLEDs. With higher mobility (usually hundreds times higher than amorphous silicon) and better stability, low temperature polysilicon thin film field effect transistors (LTPS-TFTs) can provide higher drive capacity with a smaller device size and can be applied to high definition TFT-LCDs and current-driven type TFT-OLEDs. Furthermore, the LTPS-TFT technology can integrate the integrated circuits originally provided at the periphery of the display panel directly onto the glass substrate of the display panel, whereby the panel becomes lighter and easier to carry and the performance of the display is improved with less peripheral components and lower costs.

At present, the LTPS-TFT has higher contents of impurity in its active layer, so the leakage current in the active layer is relatively great, which directly affects the switching characteristics of the display device using this kind of thin film transistors. Therefore, it has become the focus of attention to prepare thin film transistors with lower contents of impurity at a low temperature.

SUMMARY

Embodiments of the present disclosure provide a thin film transistor and a manufacturing method thereof, an array substrate, and a display device, which can manufacture a thin film transistor with lower contents of impurity at a low temperature.

One aspect of the present disclosure provides a thin film transistor, comprising a substrate, and an active layer disposed on the substrate, the active layer comprising a source region, a drain region and a channel region, wherein the active layer is formed by depositing an inducing metal on an amorphous silicon layer of the source and drain regions by an atomic layer deposition (ALD) method and then conducting heat treatment on the amorphous silicon layer deposited with the inducing metal so that metal induction crystallization and metal induction lateral crystallization take place in the amorphous silicon layer.

Another aspect of the present disclosure provides an array substrate, which comprises thin film transistors formed in array and having any features as aforementioned.

A further aspect of the present disclosure provides a display device, which comprises the aforementioned array substrate.

A further aspect of the present disclosure provides a method of manufacturing a thin film transistor, comprising providing a substrate and forming an active layer on the substrate, the active layer comprising a source region, a drain region and a channel region. Forming the active layer comprises: forming an amorphous thin film on the substrate, and forming an amorphous silicon layer in an active layer region by a patterning process; depositing an inducing metal on the amorphous silicon layer at the source and drain regions by an ALD method; conducting heat treatment on the amorphous silicon layer deposited with the inducing metal so as to form the active layer after metal induction crystallization and metal induction lateral crystallization take place in the amorphous silicon layer.

BRIEF DESCRIPTION OF THE DRAWINGS

In order to clearly illustrate the technical solution of the embodiments of the disclosure or in the prior art, the illustrative drawings used for describing the embodiments will be briefly described in the following.

DETAILED DESCRIPTION

The technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical or scientific terms used herein shall have the general meanings understandable for those ordinarily skilled in the field of the present disclosure. The words such as "one", "a", "the" or similar shall not represent limitation of numbers, but mean existence of at least one. The phases such as "include", "comprise" or similar intend to mean the elements or objects before such words cover or are equivalent to the elements or objects listed after such words, but other elements or objects are not exclusive. The words "joint", "connect" or similar are not limited to physical or chemical connection, but also include electrical connection, no matter directly or indirectly. The phases such as "on", "under", "left", "right" and the like shall be used only to represent relative positions, wherein, when the absolute position of the described object is changed, the relative positions may be changed accordingly.

A thin film transistor provided in an embodiment of the present disclosure comprises: a substrate, a gate electrode and a gate insulating layer disposed on the substrate, an active layer disposed on the substrate, wherein the active layer is formed by depositing an inducing metal on an amorphous silicon layer of the substrate by an atomic layer deposition (ALD) method and then conducting heat treatment on the amorphous silicon layer deposited with the inducing metal so that metal induction crystallization (MIC) and metal induction lateral crystallization (MILC) take place on the amorphous silicon layer. The active layer comprises a source region, a drain region and a channel region.

Figure 1:
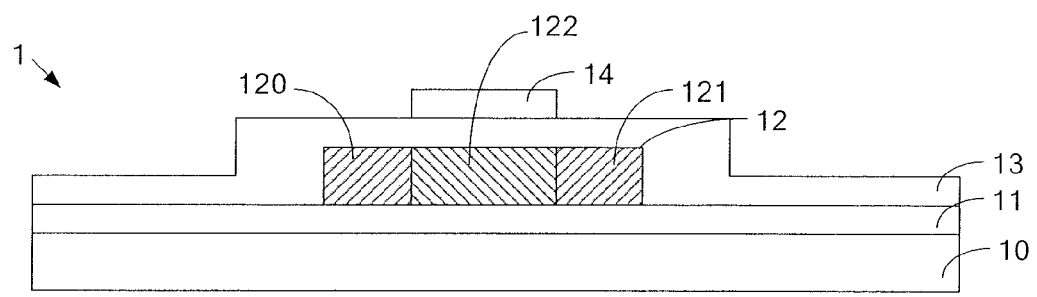
FIG. 1 is a structural schematic view of a thin film transistor provided in one embodiment of the present disclosure.

As shown in FIG. 1, a thin film transistor 1 structure provided in one embodiment of the present disclosure may comprise a substrate 10 used as a base. Since alkali glass has high contents of such metal impurities as aluminum, barium and sodium, which easily leads to diffusion of the metal impurities during the process of high temperature treatment, the material for the substrate 10 may be alkalifree glass.

A buffer layer 11 is disposed on the substrate 10, for blocking the impurities contained in the substrate 10 from entering an active layer 12, thus avoiding disadvantageous influence on the characteristics of the TFT element such as threshold voltage and leakage current.

The active layer 12 is disposed on the buffer layer 11 and is formed by depositing an inducing metal on an amorphous silicon layer of the substrate 10 by an ALD method and then conducting heat treatment on the amorphous silicon layer deposited with the inducing metal so that metal induction crystallization and metal induction lateral crystallization take place in the amorphous silicon layer. The active layer 12 comprises a source region 120, a drain region 121 and a channel region 122. When the thin film transistor is in operation, the channel region 122 provides a channel through which carriers pass. A gate insulating layer 13 is disposed on the buffer layer 11 and the active layer 12; a gate electrode 14 is disposed on the gate insulating layer 13 and over the active layer 12.

For example, the material for the buffer layer 11 is silicon oxide and/or silicon nitride. For example, the buffer layer 11 has a thickness within a range between 500 Å and 4000 Å.

Figure 2:
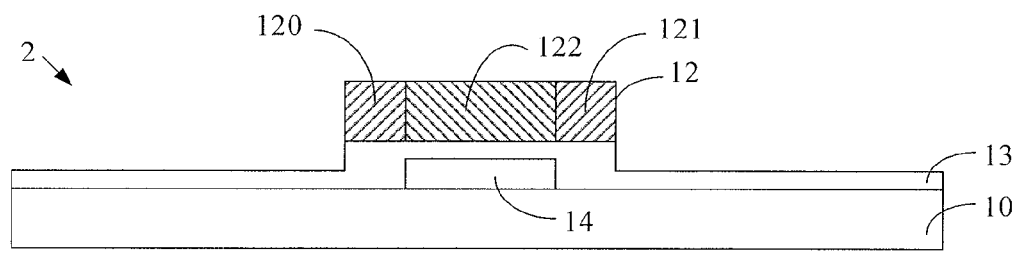
FIG. 2 is a structural schematic view of another thin film transistor provided in another embodiment of the present disclosure.

As shown in FIG. 2, a thin film transistor 2 structure provided in another embodiment of the present application may comprise a substrate 10. Since alkali glass has high contents of such metal impurities as aluminum, barium and sodium, which easily leads to diffusion of the metal impurities during the process of high temperature treatment, the material for the substrate 10 may select alkalifree glass. The gate electrode 14 is disposed on the substrate 10; the gate insulating layer 13 is disposed the substrate 10 and the gate electrode 14; the active layer 12 is disposed on the gate insulating layer 13 and over the gate electrode 14. The active layer 12 is formed by depositing an inducing metal on an amorphous silicon layer of the substrate 10 by an ALD method and then conducting heat treatment on the amorphous silicon layer deposited with the inducing metal so that metal induction crystallization and metal induction lateral crystallization take place in the amorphous silicon layer. The active layer comprises a source region 120, a drain region 121 and a channel region 122.

It shall be noted that the only difference between the two kinds of thin film transistors provided in FIG. 1 and FIG. 2 lies in that: the thin film transistor 1 in FIG. 1 has a "top-gate" structure, i.e., the active layer is disposed between the substrate and the gate insulating layer and the gate electrode is formed on the gate insulating layer; the thin film transistor 2 in FIG. 2 has a "bottom-gate" structure, i.e., the gate insulating layer covers the gate electrode and the active layer is disposed on the gate insulating layer. Therefore, the method of preparing the active layer provided inn the embodiments of the present disclosure may be applied to both the thin film transistor with the "top-gate" structure and that with the "bottom-gate" structure.

For example, the active layer has a thickness within a range between 500 Å and 1000 Å. The inducing metal may include at least one of nickel, copper, gold, silver, aluminium, cobalt and chromium.

Alkalifree glass refers to the glass that can reduce the contraction caused by heat treatment while not obviously raising the strain point. Alkalifree glass is characterized by that a ratio ($\Delta$an-st/$\alpha$50-350) of the gradient of the equilibrium density curve within a temperature range from an annealing point (Tan) to a strain point (Tst), $\Delta$an-st(ppm/° C.), to an average linear expansion coefficient at 50~350° C., $\alpha$50-350($\times 10^{-6}$/° C.) is greater than or equal to zero and less than 3.64.

The active layer of the thin film transistor in the embodiments of the present disclosure is formed by depositing an inducing metal on an amorphous silicon layer of the substrate by an ALD method and then conducting heat treatment on the amorphous silicon layer deposited with the inducing metal so that metal induction crystallization and metal induction lateral crystallization take place in the amorphous silicon layer. On one hand, by the ALD method, the amount of the deposited inducing metal can be easily controlled, thus reducing the amount of metal impurities in the active layer while having a low process temperature; on the other hand, by heat treatment on the amorphous silicon layer deposited with the inducing metal so that metal induction crystallization and metal induction lateral crystallization take place in the amorphous silicon layer, the amount of metal impurities in the active layer is further reduced, such that the thin film transistor with a lower amount of impurities may be prepared at a low temperature, e.g., less than 600° C.

An embodiment of the present disclosure provides a method of preparing a thin film transistor, comprising: forming a gate electrode and a gate insulating layer on a substrate; depositing an amorphous silicon thin film on the substrate, and forming an amorphous silicon layer in an active layer region by a patterning process; depositing an inducing metal on the amorphous silicon layer at the source and drain regions by an ALD method; conducting heat treatment on the amorphous silicon layer deposited with the inducing metal so as to form the active layer after metal induction crystallization and metal induction lateral crystallization take place in the amorphous silicon layer, the active layer comprising a source region, a drain region and a channel region.

An example of the method of preparing the thin film transistor corresponding to the thin film transistor 1 with "top-gate" structure in the above embodiments comprises Steps S101~S105.

S101, providing a substrate.

The substrate may be alkalifree glass. Alkali glass has high contents of such metal impurities as aluminum, barium and sodium, which easily leads to diffusion of the metal impurities during the process of high temperature treatment.

S102, depositing a buffer layer on the substrate.

Figure 3:
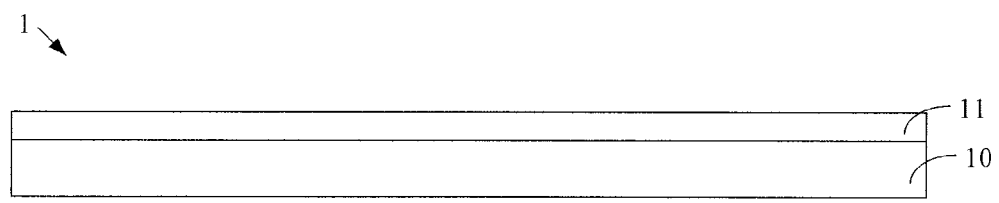
FIGS. 3-6 are structural schematic views 1-4 of a thin film transistor in the process of manufacturing one thin film transistor provided in one embodiment of the present disclosure.

As shown in FIG. 3, on the pre-cleaned substrate 10, a PECVD (plasma enhanced chemical vapor deposition) method is used to form the buffer layer 11 so as to block the impurities contained in the substrate 10 from entering the active layer to be formed later, thus avoiding disadvantageous influence on the characteristics of the TFT element such as threshold voltage and leakage current. The method of forming the buffer layer 11 on the substrate 10 may also include LPCVD (low pressure chemical vapor deposition), APCVD (air pressure chemical vapor deposition), ECR-CVD (electron cyclotron resonance chemical vapor deposition), sputtering or the like.

The material for the buffer layer 11 is silicon oxide and/or silicon nitride, that is, the buffer layer 11 may be a single layer of silicon oxide or silicon nitride, or a laminated layer of them.

For example, the buffer layer 11 has a thickness within a range between 300 Å and 10000 Å, and further for example within a range between 500 Å and 4000 Å. The temperature for depositing the buffer layer 11 may be not higher than 600° C., i.e., the deposition temperature is 600° C. or lower.

S103, depositing an amorphous silicon thin film on the buffer layer, and forming an amorphous silicon layer in an active layer region by a patterning process.

Figure 4:
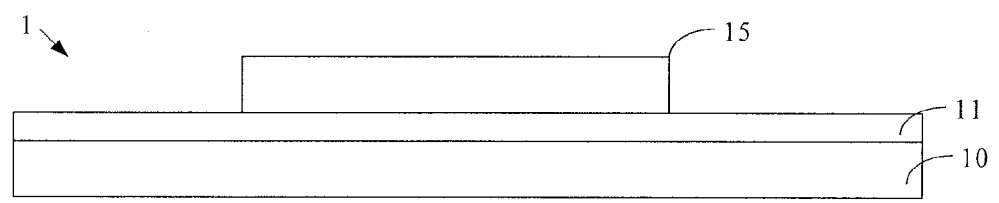

As shown in FIG. 4, the amorphous silicon thin film is deposited on the buffer layer 11 by PECVD, LPCVD or sputtering method, and is patterned to form an amorphous silicon layer 15. In one example, the amorphous silicon thin film is deposited on the buffer layer 11, forming an etching mask by a photolithography process and then forming a pattern by a dry etch process, so as to form the amorphous silicon layer 15. The deposition temperature may be no higher than 600° C. For example, a microcrystalline silicon thin film and etc. may be deposited on the buffer layer 11 by PECVD, LPCVD or sputtering method and may also be patterned.

It shall be added that many steps of process for preparing chips adopt photolithography technology in the manufacturing of semiconductor. The pattern "negative plate" used for the steps is called as "mask", with the purpose of shielding a selected region on the silicon chip with an opaque pattern template, such that the subsequent erosion or diffusion will affect the regions outside the selected region.

Figure 5:
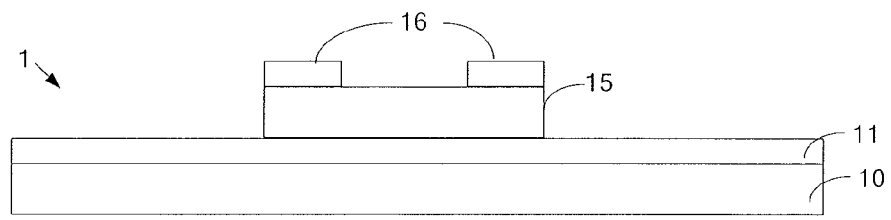

S104, depositing an inducing metal on the amorphous silicon layer at the source and drain regions by an ALD method As shown in FIG. 5, an ALD method is adopted to deposit an inducing metal 16 on the source and drain regions of the amorphous silicon layer 15.

For example, the temperature for depositing the inducing metal may be no higher than 400° C., for example, be 200° C.~400° C. Of course, the specific temperature and time may be determined according to the material of the deposited metal and the practical requirements.

The ALD method is introduced briefly herein. ALD is a method of depositing substance on a surface of the substrate, layer by layer, in a manner of monatomic film. In the process of ALD, the chemical reaction of the atomic film of a new layer is directly related to the previous one layer. In this manner, only one layer of atom can be deposited in each reaction. Since ALD realizes the growth of thin film in the order of monatomic layer, the thin film deposited by the ALD technology is uniform and has high purity and good shape retention. At the same time, the thickness and composition of the film layer may be precisely controlled, and the process temperature may be low.

Therefore, the embodiments of the present disclosure adopt ALD to deposit the inducing metal so as to precisely control the amount of metal, achieve a stable process, and prepare a TFT with excellent performance.

The inducing metal may include at least one of nickel, copper, gold, silver, aluminium, cobalt and chromium, and may have a thickness within a range of 1 Å and 100 Å, for example, may have a thickness within a range of 5 Å and 20 Å.

S105, conducting heat treatment on the amorphous silicon layer deposited with the inducing metal so as to form an active layer.

Figure 6:
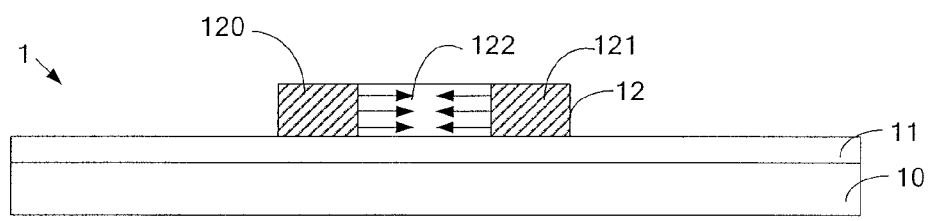

As shown in FIG. 6, the amorphous silicon layer deposited with the inducing metal is heat-treated so as to form the active layer 12. In one example, the inducing metal deposited in regions corresponding to the source region and drain region on the amorphous silicon layer is activated by heat treatment. The method of rapid thermal annealing (RTA) or excimer laser crystallization (ELC) may be applied to the heat treatment. The RTA method uses tungsten halogen lamps or xenon arc lamps to heat the substrate at temperatures ranging from 700° C.~800° C. for several seconds or several minutes. The ELC method uses excimer laser to heat the substrate at very high temperatures for a very short period of time. In the embodiments of the present disclosure, such inducing metals may be used so that metal induction crystallization and metal induction lateral crystallization may take place on the amorphous silicon layer at a low temperature ranging from 300° C.~600° C. For example, the heat treatment may be performed in a furnace under 400° C.~600° C. for 0.1-50 hours, and preferably 0.5-20 hours. During the heat treatment in the furnace, the inducing metal in the source and drain regions of the amorphous silicon layer causes metal induction crystallization in the amorphous silicon layer (shadow area in FIG. 6), and metal induction lateral crystallization in the region not covered by the inducing metal (the arrow in FIG. 6 represents the propagation direction of the metal induction lateral crystallization), whereby the amorphous silicon of the amorphous silicon layer is converted into polysilicon so that the active layer 12 is formed.

S106, depositing a gate insulating layer and a gate electrode on the active layer and the buffer layer.

Up to now, the thin film transistor 1 having a "top-gate" structure as shown in FIG. 1 is prepared, in which the active layer is formed between the substrate and the gate insulating layer and the gate electrode is formed on the gate insulating layer.

An example of the method of preparing the thin film transistor corresponding to the thin film transistor 2 with "bottom-gate" structure in the above embodiment comprises steps S201~S205.

S201, providing a substrate.

The substrate may be alkalifree glass. Alkali glass has high contents of such metal impurities as aluminum, barium and sodium, which easily leads to diffusion of the metal impurities during the process of high temperature treatment.

S202, forming a gate electrode and depositing a gate insulating layer on the substrate.

Figure 7:
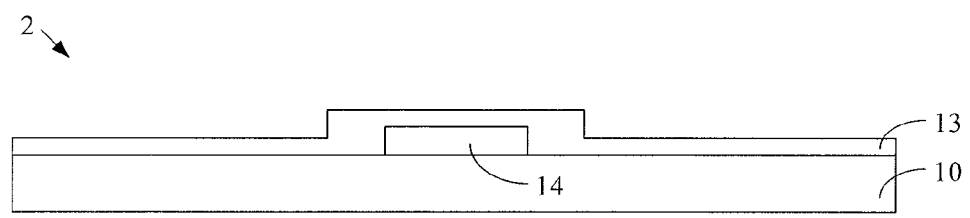
FIGS. 7-9 are structural schematic views 1-4 of a thin film transistor in the process of manufacturing one thin film transistor provided in another embodiment of the present disclosure.

As shown in FIG. 7, preparing the thin film transistor with "bottom-gate" structure comprises: firstly forming a gate electrode 14 on the substrate 10, and depositing a gate insulating layer 13 on the substrate 10 and the gate electrode 14.

S203, depositing an amorphous silicon thin film on the gate insulating layer, and forming an amorphous silicon layer in an active layer region by a patterning process.

Figure 8:
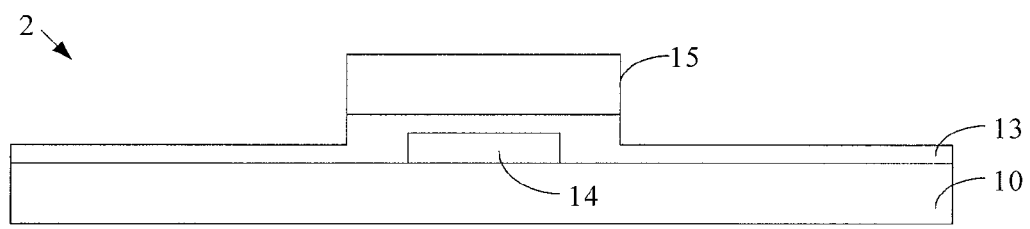

Similar to the aforementioned embodiment, as shown in FIG. 8, the amorphous silicon thin film is deposited on the gate insulating layer 13 by PECVD, LPCVD or sputtering method, and is patterned to form an amorphous silicon layer 15. For example, the amorphous silicon thin film is deposited on the gate insulating layer 13, forming an etching mask by photolithography process and then forming a pattern by a dry etch process, so as to form the amorphous silicon layer 15. The deposition temperature may be no higher than 600° C.

S204, depositing an inducing metal on the amorphous silicon layer at the source and drain regions by an ALD method.

Figure 9:
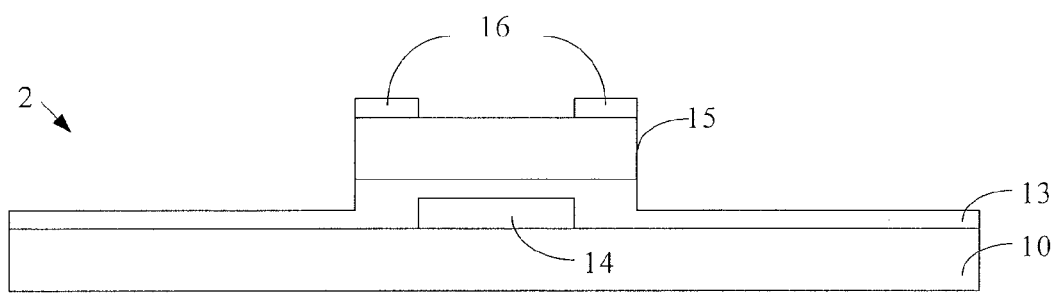

As shown in FIG. 9, an ALD method is adopted to deposit an inducing metal 16 on corresponding regions (i.e., regions corresponding to the source and drain regions) of the amorphous silicon layer 15.

The inducing metal may include at least one of nickel, copper, gold, silver, aluminium, cobalt and chromium, and may have a thickness within a range of 1 Å and 100 Å, for example, may have a thickness within a range of 5 Å and 20 Å.

S205, conducting heat treatment on the amorphous silicon layer deposited with the inducing metal so as to form the active layer.

Similar to the step 105, the heat treatment is performed on the amorphous silicon layer deposited with the inducing metal so as to form the active layer 12. No more details are dealt with herein.

Up to now, the thin film transistor 2 having a "bottom-gate" structure as shown in FIG. 2 has been prepared, in which the gate insulating layer covers the gate electrode, and the active layer is formed on the gate insulating layer.

An active layer is thus prepared by the manufacturing method of a thin film transistor provided in the embodiments of the present disclosure. On one hand, by the ALD method, the deposition rate and deposition thickness can be effectively controlled, so the amount of the deposited inducing metal can be easily controlled, thus reducing the amount of metal impurities in the active layer while having a low process temperature. In comparison, it is not easy to control the amount of deposition by the methods for depositing inducing metal, i.e. sputtering method, in the prior art. A large amount of inducing metal (generally up to 200 Å~400 Å) will be deposited in a very short period of time, which is much more than the demand for inducing metal 104; in contrast, generally the inducing metal requires only the trace amount (a thickness of several Å). On the other hand, by heat treatment on the amorphous silicon layer deposited with the inducing metal so that metal induction crystallization and metal induction lateral crystallization take place in the amorphous silicon layer, the amount of metal impurities in the active layer is further reduced, such that the thin film transistor with lower amount of impurities may be prepared at a low temperature.

An embodiment of the present disclosure provides an array substrate, which comprises thin film transistor formed in array and having the features as described in the above embodiments. The thin film transistor is identical to any one that is described in the above embodiments, and no more details are dealt with herein.

An embodiment of the present disclosure provides a display device, which comprises an array substrate having the features as described in the above embodiments. For example, the display device may be a liquid crystal display device, which comprises an opposed substrate (e.g., a color filter substrate) and an array substrate as described in the above embodiments that are disposed in parallel with each other, and a liquid crystal filled between the color filter substrate and the array substrate. The display device may also be an OLED display device, which comprises an array substrate as described in the above embodiments, an organic light emitting material evaporated on the array substrate, and an encapsulating cover.

The liquid crystal display device provided in the embodiment of the present disclosure may be a liquid crystal display, a liquid crystal television, a digital photoframe, a mobile phone, a flat panel computer and other products or members having display function, and the present disclosure is not limited to these.

The above embodiments of the present disclosure are given by way of illustration only and thus are not limitative of the protection scope of the present disclosure, which is determined by the attached claims.

What is claimed is:

1. A thin film transistor, comprising:
   a substrate,
   an active layer disposed on the substrate, the active layer comprising a source region, a drain region and a channel region, wherein
   the active layer is formed by depositing an inducing metal on an amorphous silicon layer of the source and drain regions by an atomic layer deposition (ALD) method and then conducting heat treatment on the amorphous silicon layer deposited with the inducing metal so that metal induction crystallization and metal induction lateral crystallization take place in the amorphous silicon layer.

2. The thin film transistor according to claim 1, further comprising: a gate electrode and a gate insulating layer, the active layer being disposed between the substrate and the gate insulating layer, and the gate electrode being formed on the gate insulating layer.

3. The thin film transistor according to claim 2, further comprising:
   a buffer layer disposed between the substrate and the active layer.

4. The thin film transistor according to claim 1, further comprising: a gate electrode and a gate insulating layer between the active layer and the substrate, the gate insulating layer covering the gate electrode, and the active layer being disposed on the gate insulating layer.

5. The thin film transistor according to claim 1, wherein the inducing metal includes at least one of nickel, copper, gold, silver, aluminium, cobalt and chromium.

6. An array substrate, comprising a thin film transistor according to claim 1.

7. A method of preparing a thin film transistor, comprising: providing a substrate and forming an active layer on the substrate, the active layer comprising a source region, a drain region and a channel region, wherein forming the active layer comprises:
   forming an amorphous thin film on the substrate, and forming an amorphous silicon layer in an active layer region by a patterning process;
   depositing an inducing metal on the amorphous silicon layer at the source and drain regions by an atomic layer deposition (ALD) method;
   conducting heat treatment on the amorphous silicon layer deposited with the inducing metal so as to form the active layer after metal induction crystallization and metal induction lateral crystallization take place in the amorphous silicon layer.

8. The method of preparing a thin film transistor according to claim 7, prior to forming the amorphous thin film on the substrate and forming the amorphous silicon layer in an active layer region by a patterning process, further comprising:
   depositing a buffer layer on the substrate.

9. The method of preparing a thin film transistor according to claim 7, wherein the temperature for depositing the inducing metal is no higher than 400° C.

* * * * *